United States Patent
Chung et al.

(10) Patent No.: US 11,127,767 B2
(45) Date of Patent: Sep. 21, 2021

(54) ARRAY SUBSTRATE, METHOD FOR MANUFACTURING THE SAME AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Jaemoon Chung, Beijing (CN); Niannian Wang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 112 days.

(21) Appl. No.: 16/465,791

(22) PCT Filed: Nov. 13, 2018

(86) PCT No.: PCT/CN2018/115177
§ 371 (c)(1),
(2) Date: May 31, 2019

(87) PCT Pub. No.: WO2019/184380
PCT Pub. Date: Oct. 3, 2019

(65) Prior Publication Data
US 2020/0365624 A1    Nov. 19, 2020

(30) Foreign Application Priority Data

Mar. 27, 2018   (CN) .......................... 201810260421.6

(51) Int. Cl.
*H01L 27/12*      (2006.01)
*H01L 21/66*      (2006.01)
(Continued)

(52) U.S. Cl.
CPC .......... *H01L 27/1248* (2013.01); *H01L 22/30* (2013.01); *H01L 27/124* (2013.01);
(Continued)

(58) Field of Classification Search
CPC ............ H01L 27/1248; H01L 27/1225; H01L 27/124; H01L 27/1262; G02F 1/136227; G02F 1/133555; G02F 2202/02
See application file for complete search history.

(56) References Cited

U.S. PATENT DOCUMENTS 8,115,894 B2 *   2/2012   Kim .................. G02F 1/136227
                                                           349/114
8,673,694 B2 *   3/2014   Park .................... H01L 27/1248
                                                           438/149

(Continued)

FOREIGN PATENT DOCUMENTS

CN       203134796 U     8/2013
CN       108461506 A     8/2018

OTHER PUBLICATIONS

International Search Report and Written Opinion for Application No. PCT/CN2018/115177, dated Feb. 13, 2019, 10 pages.

*Primary Examiner* — Mohsen Ahmadi
(74) *Attorney, Agent, or Firm* — Brooks Kushman P.C.

(57) ABSTRACT

An array substrate, a method for manufacturing the array substrate and a display device are provided. The array substrate includes a substrate, an organic film layer and a passivation layer; the organic film layer is arranged between the substrate and the passivation layer; a venting hole is formed in the passivation layer.

10 Claims, 4 Drawing Sheets

(51) Int. Cl.
*G02F 1/1335* (2006.01)
*G02F 1/1362* (2006.01)

(52) U.S. Cl.
CPC ...... *H01L 27/1225* (2013.01); *H01L 27/1262* (2013.01); *G02F 1/133555* (2013.01); *G02F 1/136227* (2013.01); *G02F 2202/02* (2013.01)

(56) References Cited

U.S. PATENT DOCUMENTS

| | | | |
|---|---|---|---|
| 10,043,830 B2* | 8/2018 | Park | H01L 27/124 |
| 10,553,613 B2* | 2/2020 | Chung | G02F 1/133305 |
| 2002/0109811 A1 | 8/2002 | Park et al. | |
| 2003/0123001 A1 | 7/2003 | Ha et al. | |
| 2016/0043117 A1* | 2/2016 | Guo | H01L 27/124 |
| | | | 438/158 |
| 2016/0359054 A1* | 12/2016 | Fang | H01L 29/78633 |
| 2017/0146874 A1* | 5/2017 | Feng | G02F 1/13439 |
| 2017/0148819 A1* | 5/2017 | Lin | H01L 21/77 |

\* cited by examiner

ARRAY SUBSTRATE, METHOD FOR MANUFACTURING THE SAME AND DISPLAY DEVICE

CROSS-REFERENCE TO RELATED APPLICATION APPLICATIONS

This application is the U.S. national phase of PCT Application No. PC T/CN2018/115177 filed on Nov. 13, 2018, which claims priority to Chinese Patent Application No. 201810260421.6 filed on Mar. 27, 2018, which are incorporated herein by reference in their entireties.

TECHNICAL FIELD

The present disclosure relates to the field of display panel technology, and in particular to an array substrate, a method for manufacturing the array substrate and a display device.

BACKGROUND

In an array substrate of a related display product, in order to insulate metal layers from each other or to reduce a coupling capacitance between the metal layers, an organic film layer is generally arranged between the metal layers. However, the organic film layer needs to be annealed during manufacturing this product. Impurity gas is easily volatilized during annealing process. Upper and lower sides of the organic film layer are generally provided with passivation layers, so that the impurity gas cannot be diffused out, thereby causing the impurity gas to penetrate downward and finally diffuse to an active layer, which affects Ion/Ioff characteristics of a thin film transistor (TFT) and even causes the TFT to lose efficacy.

SUMMARY

The present disclosure discloses an array substrate, including a substrate, an organic film layer and a passivation layer. The organic film layer is arranged between the substrate and the passivation layer, a venting hole is formed in the passivation layer.

Optionally, the array substrate includes an active layer; the venting hole includes a first opening; a position of an orthographic projection of the first opening onto a plane of the active layer relative to the active layer is that the orthographic projection of the first opening onto a plane of the active layer is located within a region of the active layer or located on a surrounding region close to the active layer.

Optionally, in a display region, a common electrode layer is further arranged between the organic film layer and the passivation layer.

Optionally, the array substrate includes a display region and a test region.

Optionally, the substrate of the display region further includes scanning lines and data lines crossing to each other; the venting hole further includes a second opening; an orthographic projection of the second opening onto a plane of the scanning lines is located on the scanning lines, and/or an orthographic projection of the second opening onto a plane of the data lines is located on the data lines.

Optionally, the orthographic projection of the second opening onto the plane of the scanning lines is located on an intersection region of the scanning lines and the data lines.

Optionally, in the test region, a third opening is formed in the organic film layer; the third opening corresponds to the first opening and penetrates through the first opening.

Optionally, a material of the active layer is indium gallium zinc oxide.

Optionally, a diameter of the venting hole is greater than or equal to 2 μm.

In order to solve the above problems, the present disclosure discloses a display device including the array substrate as described above.

In order to solve the above problems, the present disclosure discloses a method for manufacturing the array substrate including: providing a substrate, forming an organic film layer and a passivation layer sequentially on the substrate; and forming a venting hole in the passivation layer.

Optionally, the array substrate includes a display region and a test region; the substrate in the display region and the substrate in the test region both include an active layer; the step of the forming a venting hole in the passivation layer comprises: forming a first opening in the passivation layer, wherein a position of an orthographic projection of the first opening onto a plane of the active layer relative to the active layer is that the orthographic projection of the first opening onto a plane of the active layer is located within a region of the active layer or located on a surrounding region close to the active layer.

Optionally, the substrate in the display region further includes scanning lines and data lines crossing to each other; the step of the forming a venting hole in the passivation layer further includes: forming a second opening in the passivation layer. An orthographic projection of the second opening onto a plane of the scanning lines is located on the scanning lines, and/or an orthographic projection of the second opening onto a plane of the data lines is located on the data lines.

Optionally, the orthographic projection of the second opening onto the plane of the scanning lines is located on an intersection region of the scanning lines and the data lines.

Optionally, the method further includes: forming a third opening in the organic film layer of the test region. The third opening corresponds to the first opening and penetrates through the first opening.

BRIEF DESCRIPTION OF THE DRAWINGS

In order to more clearly illustrate the technical solutions of the embodiments of the present disclosure, the drawings to be used in the description of the embodiments of the present disclosure will be described briefly below. Obviously, the drawings in the following description are merely some embodiments of the present disclosure. For those skilled in the art, other drawings can also be obtained according to these drawings without the inventive labor.

DESCRIPTION OF REFERENCE NUMERALS

11—substrate; 12—organic film layer; 13—passivation layer; 14—venting hole; 21—thin film transistor; 22—scanning line; 23—data line; 40—first opening; 41—glass base; 43—gate insulating layer; 44—active layer; 46—source insulating layer; 47—common electrode layer; 48—pixel electrode layer; 49—lap hole; 51—third opening; 61—second opening.

DETAILED DESCRIPTION

In order to make the objects, technical solutions and advantages of the present disclosure more clear, detailed description is made hereinafter in conjunction with the accompanying drawings and specific embodiments.

Figure 1:
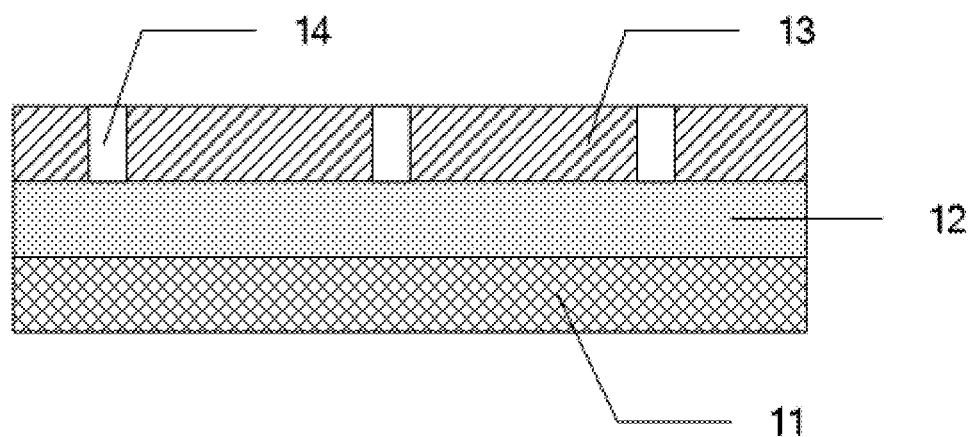
FIG. 1 is a schematic view of an array substrate according to an embodiment of the present disclosure.

An array substrate is provided according to an embodiment of the present disclosure. Referring to FIG. 1, the array substrate includes a substrate 11, an organic film layer 12 and a passivation layer 13; the organic film layer 12 is arranged between the substrate 11 and the passivation layer 13, and a venting hole 14 is formed in the passivation layer 13.

Figure 2:
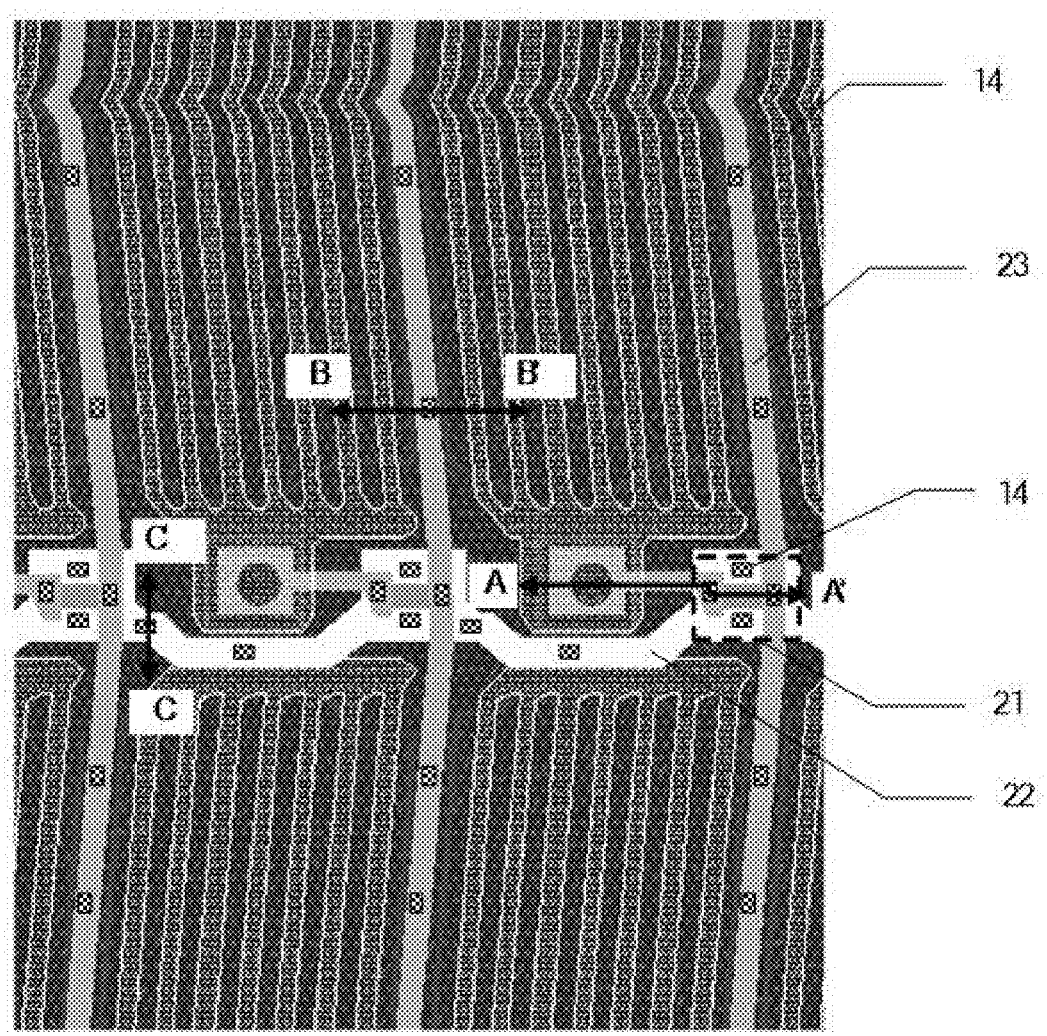
FIG. 2 is a schematic view showing a planar structure of the array substrate in a display region according to an embodiment of the present disclosure.
Figure 3:
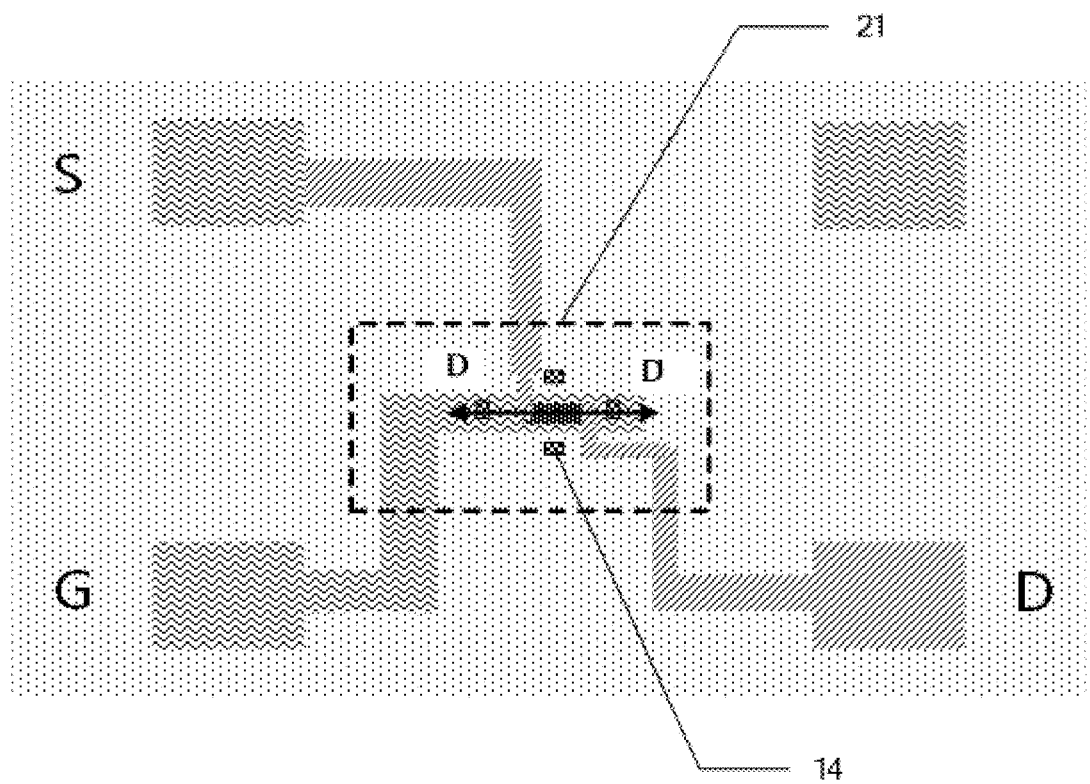
FIG. 3 is a schematic view showing a planar structure of the array substrate in a test region according to an embodiment of the present disclosure.

In practical applications, the array substrate may include a display region and a test region. Referring to FIG. 2, FIG. 2 shows a planar structural view of the array substrate in the display region. FIG. 3 shows a planar structural view of the array substrate in the test region.

The substrate in the display region and the substrate in the test region may each include a thin film transistor (TFT) 21; The thin film transistor 21 includes an active layer; the substrate in the display region further includes scanning lines 22 and data lines 23 cross to each other. In the display region, a pixel electrode layer 48 can be further arranged on a surface of the passivation layer 13 away from the organic film layer 12. In this structure, referring to FIG. 4, the pixel electrode layer 48 is electrically connected to a source electrode and a drain electrode of the thin film transistor 21 through a lap hole 49 formed in the passivation layer 13 and the organic film layer 12. It should be noted that, in the present embodiment, the venting hole 14 formed in the passivation layer 13 is different from the lap hole 49, but the passivation layer 13 and the lap hole 49 can be formed simultaneously, the details will be described in the following embodiments.

During a manufacturing process of the array substrate, it is often necessary to monitor characteristics of the TFT of the display region, such as an EPM (Electrical parameter measurement) parameter and the like. The EPM parameter is measured by a prober contact measurement which is an irreversible damage operation. Thus, EPM is generally performed on the thin film transistor 21 in the test region. Therefore, the thin film transistor 21 in the test region is used to characterize the characteristics of the TFT in the display region by measuring the EPM parameter of the thin film transistor 21 in the test region during a process.

The organic film layer 12 may be an insulating material arranged between a metal layer and another metal layer. The organic film layer 12 functions to insulate the metal layers from each other or to increase the distance between the metal layers, thereby reducing a coupling capacitance between the metal layers, and thus may also be referred to as an interlayer dielectric layer (ILD). A material of the organic film layer 12 can be $SiO_2$, $Si_3N_4$, aerogel, polymer material or the like. During a manufacturing process, such as a high temperature annealing process, impurity gas is easily generated. In the related art, since the passivation layer 13 blocks the impurity gas from being diffused outward, the impurity gas in the closed space penetrates downward, and may react with the active layer on the substrate to affect a switching characteristic of the TFT, or even cause the TFT to lose efficacy.

In order to solve this problem, in the present embodiment, a venting hole 14 is formed in the passivation layer 13, and the venting hole 14 can be formed at any position of the passivation layer 13. For example, the venting hole 14 may be formed in an orthographic projection region of the active layer on the passivation layer 13 or a region surrounding the orthographic projection region of the active layer on the passivation layer 13, or may also be arranged on an orthographic projection of the data lines and/or scanning lines of the substrate on the passivation layer 13, or may also be arranged in an effective display region. A specific position, a size and the quantity of the venting holes can be calculated and obtained by simulating the parameters and characteristics of the amount of exhaust gas, annealing temperature, time, film quality and the like, which are not limited in the present disclosure.

The array substrate provided by the present embodiment can discharge the impurity gas through the venting hole in the passivation layer to ensure that the characteristics of components, such as the TFT on the substrate, are not affected. The impurity gas is generated by the organic film layer during the manufacturing process.

In order to specially prevent the impurity gas from affecting the active layer, the venting hole in the above embodiment may include a first opening 40. A position of an orthographic projection of the first opening 40 on a plane of the active layer 44 relative to the active layer 44 satisfies a preset condition. The preset condition means that the orthographic projection of the first opening 40 onto the plane of the active layer 44 can be located in a region of the active layer 44 or may be located in a surrounding region close to the active layer 44.

Figure 4:
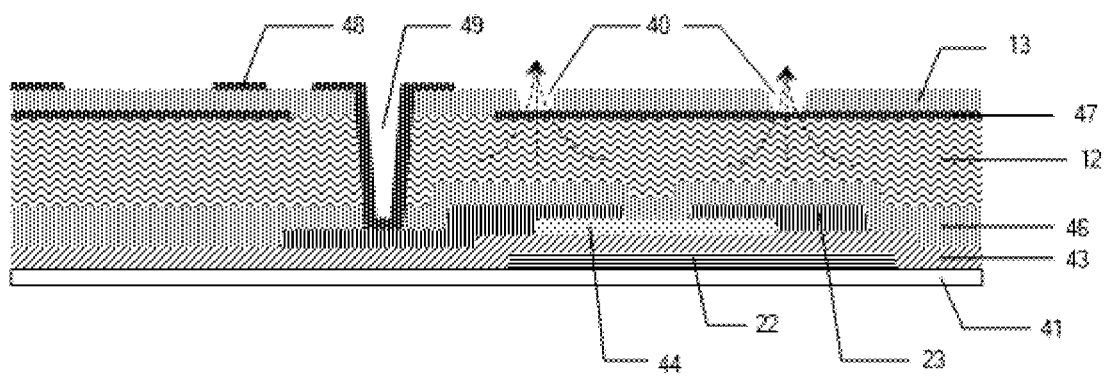
FIG. 4 is a schematic view showing a sectional structure of the array substrate in the display region along AA' according to an embodiment of the present disclosure.

FIG. 4 shows a sectional structural view of an array substrate in a display region along AA'. The array substrate in the display region along the AA' in direction from bottom to top includes a glass base 41, gate lines or scanning lines 22, a gate insulating layer 43, the active layer 44, source and drain electrodes or the data lines 23, a source insulating layer 46, the organic film layer 12, a common electrode layer 47, the passivation layer 13 and the pixel electrode layer 48. The common electrode layer 47 arranged between the organic film layer 12 and the passivation layer 13 has a thickness of approximately 300 to 1000 angstroms and has a conductive function. Further, the common electrode layer 47 also has functions of isolating water molecule and permeating gas. For example, a material of the common electrode layer 47 can be ITO or MoNb or the like. In order to further increase a diffusion rate of the impurity gas, an opening can be formed in a region of the common electrode layer 47 corresponding to the thin film transistor 21. The opening and a first opening 40 in the passivation layer 13 are penetrated through. Further, the common electrode layer 47 may not arranged at a region corresponding to TFT 21 so that the impurity gas may be diffused out in time and the TFT 21 is efficiently protected. It should be noted that the common electrode layer 47 between the organic film layer 12 and the passivation layer 13 is not necessary. In practical applications, it can be specifically determined according to a display mode and the like.

Figure 5:
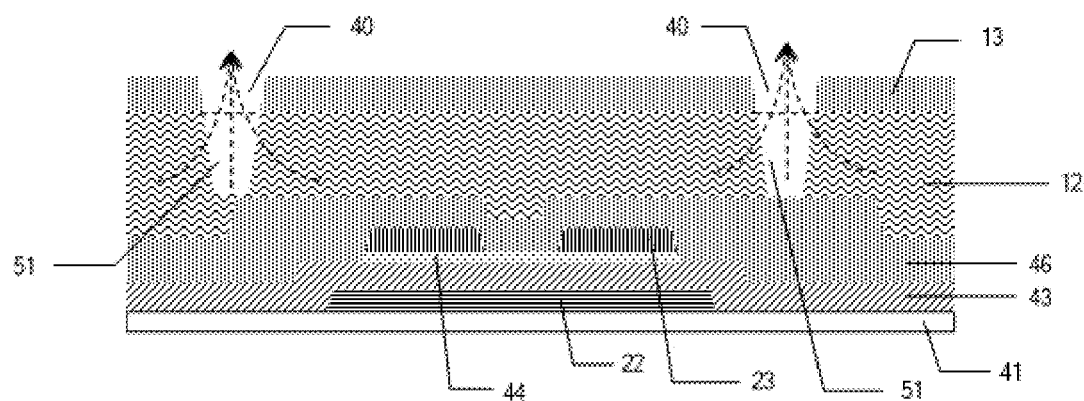
FIG. 5 is a schematic view showing a sectional structure of the array substrate in the test region along DD' according to an embodiment of the present disclosure.

FIG. 5 shows a sectional structural view of an array substrate in a test region along DD'. The array substrate in the test region along the DD' in direction from bottom to top includes a glass base 41, gate lines or scanning lines 22, a gate insulating layer 43, the active layer 44, source and drain electrodes or the data lines 23, a source insulating layer 46, the organic film layer 12 and passivation layer 13. As compared to the display region, the common electrode layer 47 and the pixel electrode layer 48 are not arranged in the test region. A third opening 51 can also be arranged in the organic film layer 12 in the test region. The third opening 51 corresponds to the first opening 40 and penetrates through the first opening 40, so that the impurity gas can be diffused out more fully and in time.

The arrangement of the first openings 40 on the passivation layer 13 can be arranged at equal intervals or can be arranged at non-equal intervals; the first openings 40 may be arranged in a lateral direction on a plane of the passivation layer 13 and/or in a longitudinal direction perpendicular to the lateral direction on the plane of the passivation layer 13. A specific position, the quantity and a size of the first opening can be determined by simulating the parameters of the amount of exhaust gas, annealing temperature and the like, which are not limited in the present disclosure. It should be noted that an arrangement of the first opening 40 in the display region and the test region, including a position, the quantity, and the size and the like, should be kept as consistent as possible, such that the consistency of the characteristics of the TFT in the test region and the display region can be improved and a reference value of the characteristics of the TFT in the test region can be ensured.

Figure 6:
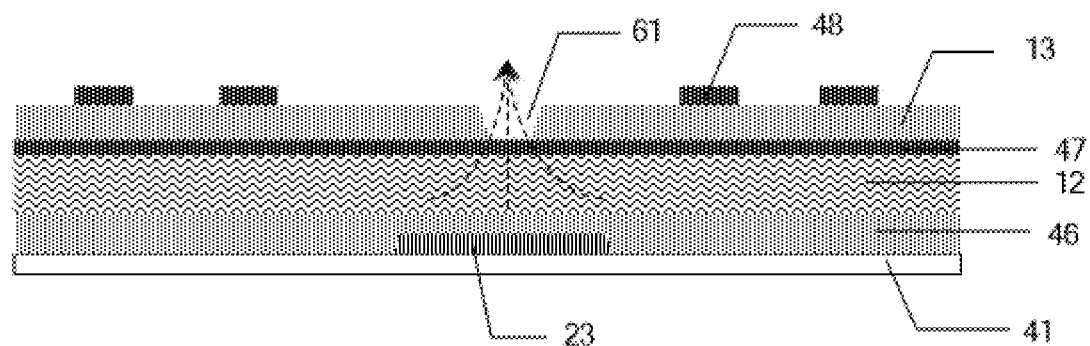
FIG. 6 is a schematic view showing a sectional structure of the array substrate in the display region along BB' according to an embodiment of the present disclosure.
Figure 7:
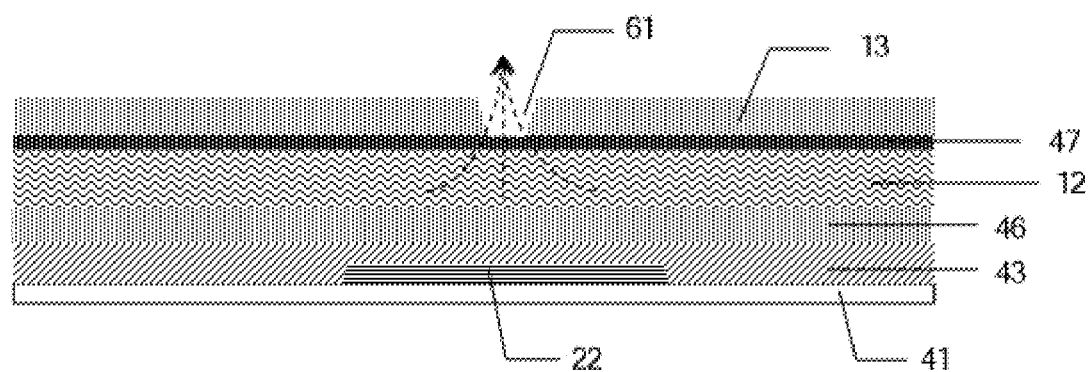
FIG. 7 is a schematic view showing a sectional structure of the array substrate in the display region along CC' according to an embodiment of the present disclosure.

In order to further prevent the impurity gas from affecting the metal layers of the scanning lines 22 and the data lines 23 of the display region, FIG. 6 and FIG. 7 are disclosed. FIG. 6 shows a sectional structural view of an array substrate in a display region along BB'; FIG. 7 shows a sectional structural view of an array substrate in a test region along CC'. The venting hole 14 may further include a second opening 61. An orthographic projection of the second opening 61 on a plane of the scanning lines 22 is located on the scanning lines 22, and/or an orthographic projection of the second opening 61 on a plane of the data lines 23 is located on the data lines 23. That is, the orthographic projection of the second opening 61 on the plane of the scanning lines 22 is distributed on the scanning lines 22; or the orthographic projection of the second opening 61 on the plane of the data lines 23 is distributed on the data lines 23; or the orthographic projection of the second opening 61 on the plane of the scanning lines 22 is distributed on the scanning lines 22, while the orthographic projection of the second opening 61 on the plane of the data lines 23 is also distributed on the data lines 23. An arrangement of the second opening 61 can be arranged at equal intervals or can be arranged at non-equal intervals; the second opening 61 can be arranged in a lateral direction on the plane of the passivation layer 13 and/or arranged in the longitudinal direction perpendicular to the lateral direction on the plane of the passivation layer 13, and can be arranged as required specifically. The orthographic projection of the second opening 61 on the plane of the scanning lines 22 can also be located at an intersection region of the scanning lines 22 and the data lines 23.

A material of the active layer 44 can be indium gallium zinc oxide (IGZO), amorphous silicon, low temperature polysilicon or the like.

A diameter of the venting hole 14 in the above embodiments can be greater than or equal to 2 μm. A size of the venting hole 14 can be determined according to actual conditions, and is not specifically limited in the present disclosure.

A display device is further provided by another embodiment of the present disclosure, including the array substrate described in any one of the above embodiments.

Figure 8:
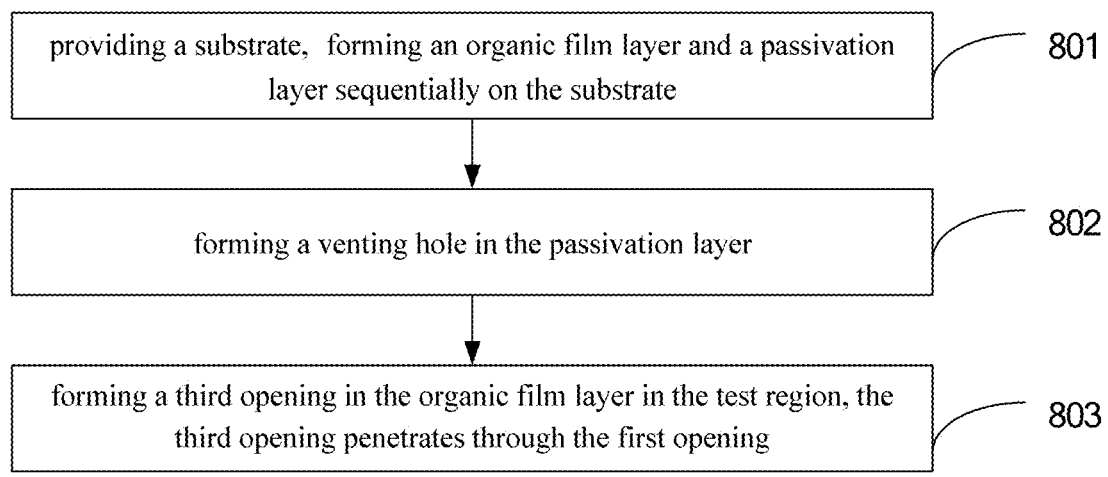
FIG. 8 shows a flow chart of a method for manufacturing the array substrate according to an embodiment of the present disclosure.

Referring to FIG. 8, a method for manufacturing the array substrate further provided by another embodiment of the present disclosure may include the following steps.

Step 801: providing the substrate, forming the organic film layer and the passivation layer sequentially on the substrate.

Specifically, layer structures on the substrate can be formed by following patterning processes: forming a film, forming a specific film layer by magnetron sputtering or the like, such as a metal film, a non-metal film, and a pixel electrode and the like; exposing and developing, coating with a PR material and exposing and developing the PR material by a mask plate to form a specific pattern; etching, including Dry Etch and Wet Etch, etching a film layer in an exposed region after exposing and developing to form a circuit and a component necessary for conduction.

Step 802: forming the venting hole in the passivation layer.

Specifically, a process of forming the venting hole can also utilize a series of patterning processes such as exposing, developing and etching as described above. In practical applications, this step can be performed synchronously with forming the lap hole, and only need to modify the mask plate accordingly. The lap hole is used for connecting the pixel electrode to the source and drain electrodes.

In order to more fully diffuse the impurity gas, the above manufacturing method may further include Step 803 of forming the third opening in the organic film layer in the test region, the third opening corresponds to the first opening 40 and penetrates through the first opening.

Specifically, in the process of forming the third opening, the passivation layer on the organic film layer may be used as the mask plate, and the organic film layer is exposed and developed to form a third opening. It should be noted that step 803 is not necessary, and the process can be specifically determined according to actual conditions.

Specifically, the array substrate may include the display region and the test region; the substrate in the display region and the substrate in the test region both include the active layer. The above step 802 may further include forming the first opening in the passivation layer, the position of the orthographic projection of the first opening onto the plane of the active layer relative to the active layer satisfies a preset condition. The preset condition means that the orthographic projection of the first opening onto the plane of the active layer may be located within the active layer region or may be located on the surrounding region close to the active layer.

The substrate in the display region further includes scanning lines and data lines cross to each other. The above step 802 may further include forming a second opening in the passivation layer, an orthographic projection of the second opening onto a plane of the scanning lines is located on the scanning lines, and/or an orthographic projection of the second opening on a plane of the data lines is located on the data lines.

The orthographic projection of the second opening onto the plane of the scanning lines is located on an intersection region of the scanning lines and the data lines.

The embodiment of the present disclosure provides an array substrate, a method for manufacturing the array substrate and a display device. The array substrate includes a substrate, an organic film layer and a passivation layer; the organic film layer is arranged between the substrate and the passivation layer; a venting hole is formed in the passivation layer. The impurity gas generated by the organic film layer during the manufacturing process may be discharged through the venting hole in the passivation layer to ensure that the characteristics of components, such as the TFT on the substrate, are not affected.

The embodiments of the present disclosure are all described in a progressive manner. Each embodiment focuses on differences from other embodiments. The same and similar parts among the embodiments can be referred to each other.

Finally, it should also be noted that, in the present disclosure, relational terms, such as "first" and "second" and the like, are used merely to distinguish one entity or operation from another entity or operation, and do not necessarily require or imply any such actual relationship or order. In addition, terms "including", "comprising" or any other variations thereof are intended to cover a non-exclusive inclusion, such that the processes, methods, commodities or devices that include a set of elements include not only those elements, but also other elements that are not explicitly listed, or elements that are inherent to such processes, methods, commodities or devices. With no more restrictions, the elements defined by the phrase "comprising a . . . " do not exclude that another identical element is included in the processes, methods, commodities or devices that include the element.

An array substrate, a method for manufacturing the array substrate and a display device provided by the present disclosure are described in detail above. The principles and embodiments of the present disclosure are set forth herein with specific embodiments. The above description of the embodiments is merely to assist in understanding the methods and the core concepts of the present disclosure. At the same time, to those skilled in the art, according to the concepts of the present disclosure, the detailed implementation and the application scope will be changed. In a word, the content of the description should not be construed as limiting the present disclosure.

What is claimed is:

1. An array substrate, comprising:
a substrate, an organic film layer and a passivation layer, wherein
the organic film layer is arranged between the substrate and the passivation layer;
a venting hole is formed in the passivation layer,
wherein the array substrate comprises an active layer; the venting hole comprises a first opening; a position of an orthographic projection of the first opening onto a plane of the active layer relative to the active layer is that the orthographic projection of the first opening onto a plane of the active layer is located within a region of the active layer or is located on a surrounding region close to the active layer,
wherein the array substrate comprises a display region and a test region, and wherein, in the test region, a third opening is formed in the organic film layer; the third opening corresponds to the first opening and penetrates through the first opening.

2. The array substrate according to claim 1, wherein a common electrode layer is further arranged between the organic film layer and the passivation layer.

3. The array substrate according to claim 1, wherein the substrate in the display region further comprises scanning lines and data lines crossing to each other; the venting hole further comprises a second opening; an orthographic projection of the second opening on a plane of the scanning lines is located on the scanning lines, and/or an orthographic projection of the second opening on a plane of the data lines is located on the data lines.

4. The array substrate according to claim 3, wherein the orthographic projection of the second opening onto the plane of the scanning lines is located on an intersection region of the scanning lines and the data lines.

5. The array substrate according to claim 1, wherein a material of the active layer is indium gallium zinc oxide.

6. The array substrate according to claim 1, wherein a diameter of the venting hole is greater than or equal to 2 µm.

7. A display device, comprising the array substrate according to claim 1.

8. A method for manufacturing an array substrate, comprising:
providing a substrate;
forming an organic film layer and a passivation layer sequentially on the substrate; and
forming a venting hole in the passivation layer,
wherein the array substrate comprises a display region and a test region; the substrate in the display region and the substrate in the test region both comprise an active layer;
the step of the forming a venting hole in the passivation layer comprises: forming a first opening in the passivation layer, wherein a position of an orthographic projection of the first opening onto a plane of the active layer relative to the active layer is that the orthographic projection of the first opening onto a plane of the active layer is located within a region of the active layer or located on a surrounding region close to the active layer,
wherein the method further comprises: forming a third opening in the organic film layer in the test region, wherein the third opening corresponds to the first opening and penetrates through the first opening.

9. The method according to claim 8, wherein the substrate in the display region further comprises scanning lines and data lines crossing to each other; the step of the forming a venting hole in the passivation layer further comprises:
forming a second opening in the passivation layer, wherein an orthographic projection of the second opening onto a plane of the scanning lines is located on the scanning lines, and/or an orthographic projection of the second opening onto a plane of the data lines is located on the data lines.

10. The method according to claim 9, wherein the orthographic projection of the second opening onto the plane of the scanning lines is located on an intersection region of the scanning lines and the data lines.

* * * * *